(12) United States Patent
Chen et al.

(10) Patent No.: US 8,303,183 B2
(45) Date of Patent: Nov. 6, 2012

(54) SLIDE ASSEMBLY

(75) Inventors: Ken-Ching Chen, Kaohsiung Hsien (TW); Wei-Sheng Wang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 355 days.

(21) Appl. No.: 12/562,512

(22) Filed: Sep. 18, 2009

(65) Prior Publication Data

US 2010/0008608 A1 Jan. 14, 2010

Related U.S. Application Data

(63) Continuation-in-part of application No. 11/433,441, filed on May 15, 2006, now abandoned.

(51) Int. Cl.
*F16C 29/06* (2006.01)
*A47B 88/04* (2006.01)
(52) U.S. Cl. .................. 384/45; 312/334.11; 312/334.33
(58) Field of Classification Search .................. 384/43, 384/44, 45, 18, 19; 312/334.11, 334.13, 312/334.17, 334.33, 334.34
See application file for complete search history.

(56) References Cited

U.S. PATENT DOCUMENTS

| | | | | | |
|---|---|---|---|---|---|
| 3,937,531 | A | * | 2/1976 | Hagen et al. | 384/18 |
| 3,950,040 | A | * | 4/1976 | Fall | 384/45 |
| 4,095,854 | A | * | 6/1978 | Teramachi | 384/45 |
| 4,348,063 | A | * | 9/1982 | Chambers | 384/18 |
| 4,892,415 | A | * | 1/1990 | Katahira | 384/45 |
| 4,917,508 | A | * | 4/1990 | Mottate | 384/45 |
| 6,379,045 | B1 | * | 4/2002 | Cirocco | 384/18 |
| 2001/0022868 | A1 | * | 9/2001 | Teramach et al. | 384/45 |
| 2003/0111942 | A1 | * | 6/2003 | Judge et al. | 312/334.46 |
| 2006/0081736 | A1 | * | 4/2006 | Chen et al. | 248/68.1 |

* cited by examiner

*Primary Examiner* — Thomas R. Hannon
*Assistant Examiner* — Alan Waits
(74) *Attorney, Agent, or Firm* — Rosenberg, Klein & Lee (57) ABSTRACT

A slide assembly may be associated with a foldable cable management arm. The slide assembly includes inner and outer rails. The inner rail is slidable in the outer rail. The inner rail includes a ball bearing carrier disposed close to an end of the inner rail. The ball bearing carrier includes upper and lower ball receiving channels. The inner rail may be directly provided with the upper and the lower ball receiving channels and the ball bearings. Each of the upper and the lower ball receiving channels includes an open section positioned in use facing the outer rail. A plurality of ball bearings are contained in both the upper and the lower ball receiving channels and roll along the open sections of the upper and the lower ball receiving channels to support the outer rail.

6 Claims, 10 Drawing Sheets

FIG. 10
PRIOR ART

SLIDE ASSEMBLY

RELATED APPLICATION

This is a continuation-in-part application of application Ser. No. 11/433,441 filed on May 15, 2006, now pending.

BACKGROUND OF THE INVENTION

1. Field of the Invention

The present invention relates to a slide assembly, and more particularly, to one that may be incorporated with a foldable cable management arm and that contains an inner rail provided with a ball bearing carrier to support an end of the inner rail throughout the sliding motion of the inner rail in relation to an outer rail.

2. Description of the Prior Art

In the design of a slide assembly, particularly for one to be incorporated with a foldable cable management arm, there is no support between an end of an inner rail and an outer rail when the inner rail operates in relation to the outer rail on ball bearings as a slide media. This is because the ball bearings on which the inner rail slides usually do not extend along the length of the outer rail. The end of the inner rail is often caught in a suspension status when the inner rail is fully retracted into the outer rail. Accordingly, the suspended terminal is vulnerable to twisting. Thus, when a front brace of a cable management arm is linked to the end of the inner rail, there is insufficient support for the inner rail where it is linked to the brace. This results in serious sloping of the cable management arm.

Figure 10:
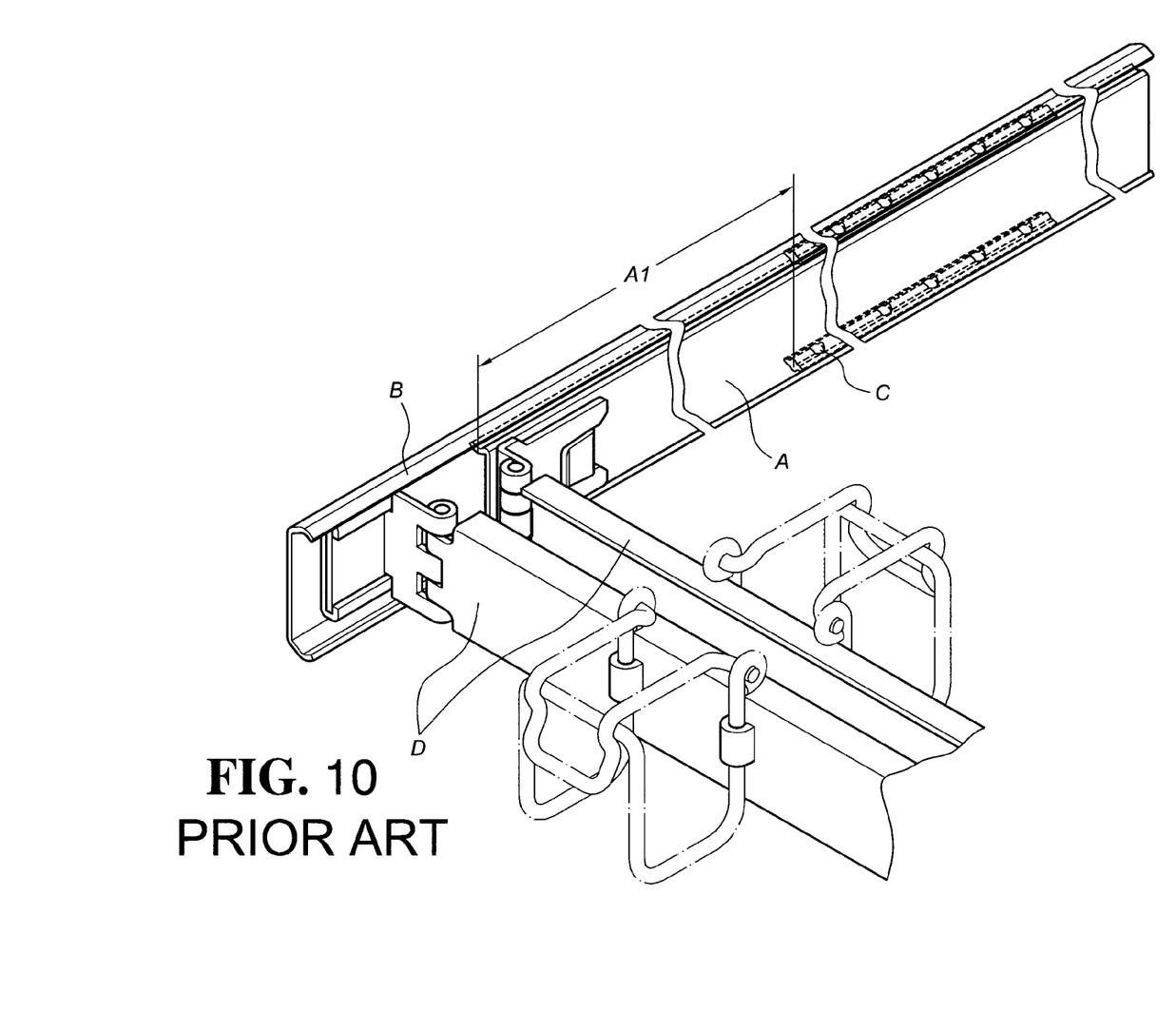
FIG. 10 is a perspective view of the prior art.

Referring to FIG. 10 of the accompanying drawings, when an inner rail (A) of a slide assembly is fully retracted into an outer rail (B), there is an absence of ball bearings (C) to support the area between the end of the inner rail (A) and the outer rail (B). Thus the end of the inner rail (A) without support from the ball bearings (C) becomes a suspended rail (A1). When the slide assembly is mounted on a cable management arm (D), a brace at the front of the cable management arm is connected to the suspended rail (A1) such that the retracted cable management arm (D) acts as a cantilever in relation to the inner rail (A). Therefore, the centre of gravity of the cable management arm (D) plus that of the cable (not illustrated) would cause the suspended rail (A1) of the inner rail (A) to twist. This would compromise the requirement for a firm support at the location where the cable management arm (D) is connected to the inner rail (A) and would cause the cable management arm (D) to slope. If the cable management arm (D) comprises upper and lower arms (D), this sloping of the cable management arm (D) will interfere with a drawer or similar object associated with the slide assembly or the lower cable management arm (D). This will affect the normal pull and push operation of the lower cable management arm (D) or the drawer or similar object.

In addition, U.S. Patent Application Publication No. 2001/0022868 A1 to Teramach et al., which discloses inner rail side ball circulation passages 16 that are directly formed on an internal part of one end side of an inner rail 8 to accommodate balls 12. It shows the inner rail 8 has a thickness which is larger than a diameter of each of the balls 12, and the inner rail 8 is a thick slide type that is not disclosed to be associated with a foldable cable management arm.

SUMMARY OF THE INVENTION

The purpose of the present invention is to provide a supporting structure for a slide assembly, particularly one adapted to form part of a foldable cable management arm to support an inner rail all throughout sliding motion of the inner rail relative to an outer rail, while correcting the problem of insufficient support by a slide support of the prior art when the inner rail is fully retracted relative to the outer rail.

According to a first aspect of the present invention, there is provided a slide assembly. The slide assembly comprises an inner rail and an outer rail. The inner rail is slidable in the outer rail. A ball bearing carrier is disposed on the side wall of the inner rail. The ball bearing carrier includes an upper ball receiving channel and a lower ball receiving channel. Alternatively the upper ball receiving channel and the lower ball receiving channel are directly provided on the inner rail. Each of the upper and the lower ball receiving channels defines a circulating channel and includes an open section located in use facing the outer rail. A plurality of ball bearings are contained in both the upper and the lower ball receiving channels, and the ball bearings roll along the open sections of the upper and the lower ball receiving channels to support the outer rail. Wherein each of the open sections of the upper and the lower ball receiving channels is a section of a ball receiving groove of the inner rail near an end of the inner rail, and both ends of each of the open sections of the inner rail are provided with a gap positioned in use facing each outlet of the upper and the lower ball receiving channels respectively.

According to a second aspect of the present invention, there is provided a slide assembly. The slide assembly comprises an outer rail, a middle rail slidably connected to the outer rail, and an inner rail slidably connected to the middle rail. The inner rail comprises an upper wall, a lower wall, and a side wall extending between the upper and the lower walls. Each of the upper and the lower walls defines a ball receiving groove. The upper and the lower walls and the side wall cooperate to define a passage. A ball bearing carrier is fixed on the side wall of the inner rail and comprises an upper ball receiving channel and a lower ball receiving channel. Each of the upper and the lower ball receiving channels defines a circulating channel. Each of the upper and the lower ball receiving channels includes an open section located in use facing the middle rail. A plurality of ball bearings are contained in both the upper and the lower ball receiving channels, and the ball bearings roll along the open sections of the upper and the lower ball receiving channels to support the middle rail. Wherein each of the open sections of the upper and the lower ball receiving channels is a section of the ball receiving groove of the inner rail near an end of the inner rail, and both ends of each of the open sections of the inner rail are provided with a gap positioned in use facing each outlet of the upper and the lower ball receiving channels respectively.

Preferably, the ball bearing carrier is fixed near the end of the inner rail, or the inner rail is directly provided with the upper and the lower ball receiving channels and the ball bearings near the end of the inner rail.

Another purpose of the present invention is to provide a slide assembly of a foldable cable management arm for increasing the support capability of the cable management arm connected to the slide assembly.

According to a third aspect of the present invention, there is provided a slide assembly of a foldable cable management arm. The slide assembly comprises an outer rail; an inner rail slidably connected to the outer rail and comprising an upper wall, a lower wall, a side wall extending between the upper and the lower walls, each of the upper and the lower walls defining a ball receiving groove, the upper and the lower walls and the side wall cooperating to define a passage; and a ball bearing carrier fixed on the inner rail and comprising an upper ball receiving channel and a lower ball receiving channel. Each of the upper and the lower ball receiving channels defines a circulating channel. Each of the upper and the lower ball receiving channels includes an open section located in use facing the outer rail. A plurality of ball bearings are contained in both the upper and the lower ball receiving channels, and the ball bearing roll along the open sections of the upper and the lower ball receiving channels to support the outer rail. Each of the open sections of the upper and the lower ball receiving channels is a section of the ball receiving groove of the inner rail near an end of the inner rail. Both ends of each of the open sections of the inner rail are provided with a gap positioned in use facing each outlet of the upper and the lower ball receiving channels respectively. The cable management arm comprises a front brace and a rear brace. The front brace is secured to the end of the inner rail, the rear brace is secured to the outer rail, and the front brace is movable relative to the rear brace.

Accordingly, the inner rail of the present invention when fully retracted or sliding in relation to the outer rail is supported by the outer rail thus providing a more steady and safer support for the slide assembly than the prior art arrangements.

DETAILED DESCRIPTION OF THE PREFERRED EMBODIMENTS

Figure 1:
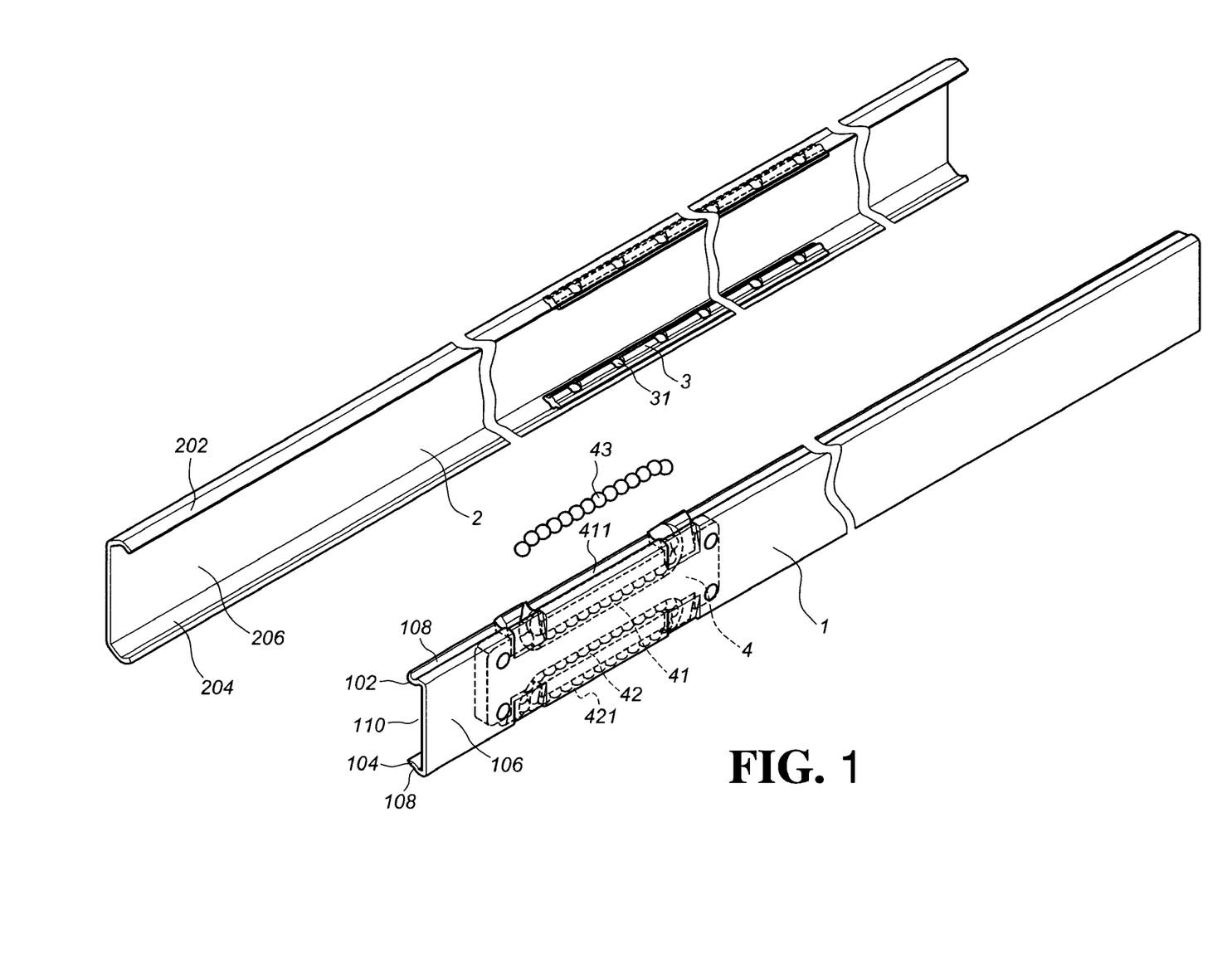
FIG. 1 is a perspective view of a first preferred embodiment of the present invention.
Figure 2:
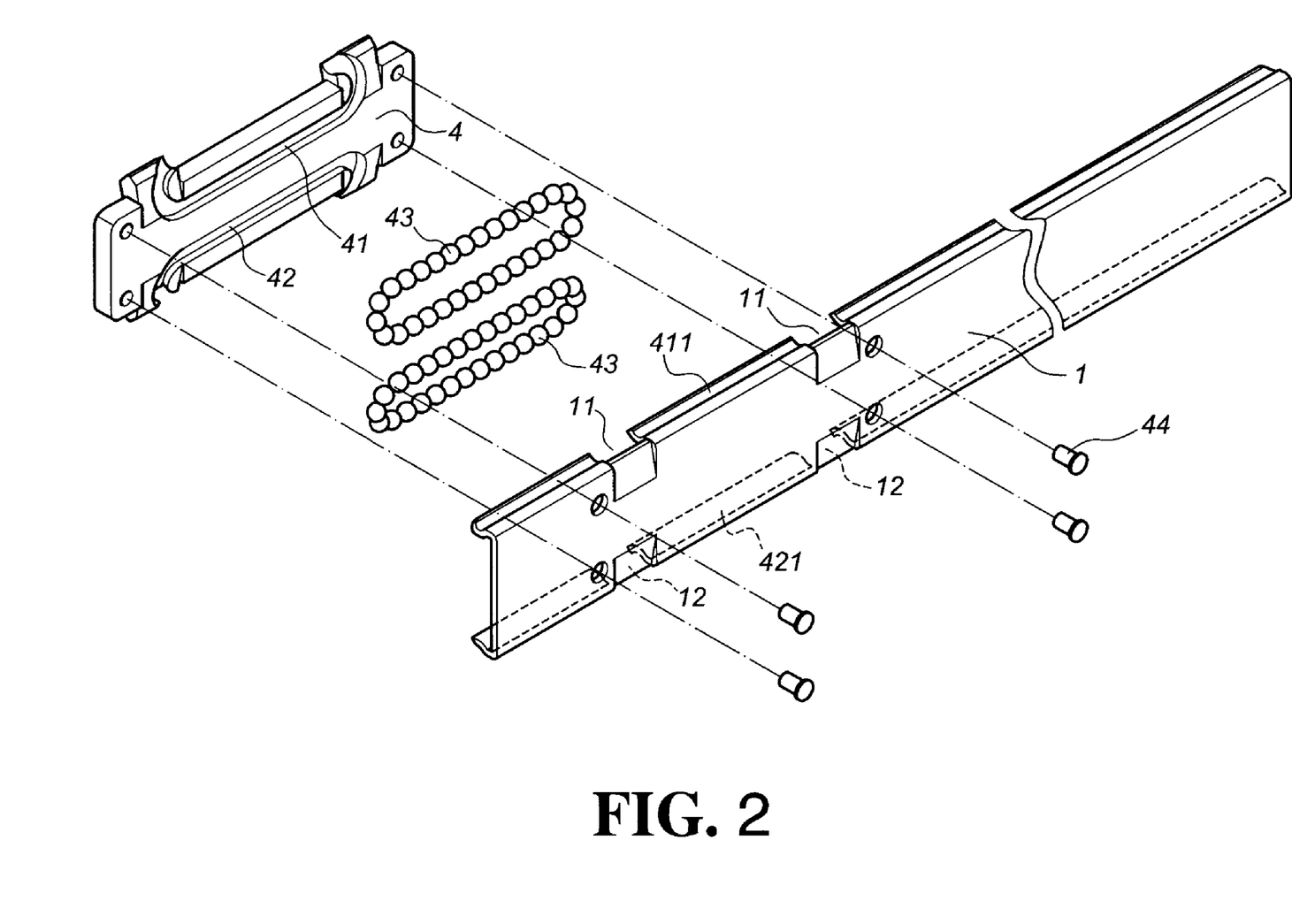
FIG. 2 is an exploded view of a primary construction of the first preferred embodiment of the present invention.
Figure 3:
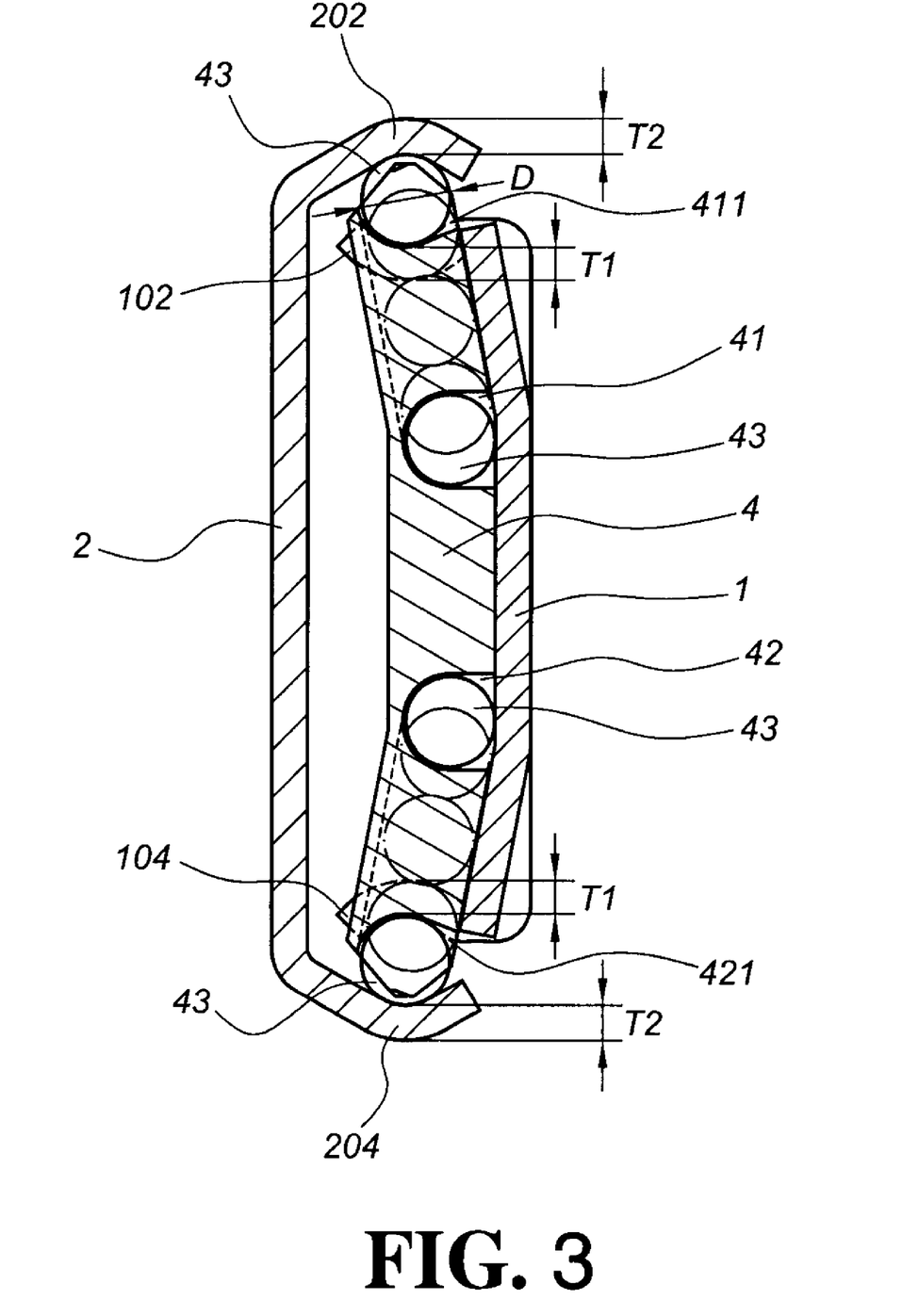
FIG. 3 is a sectional view showing the first preferred embodiment of the present invention as assembled.

Referring to FIGS. 1, 2, and 3, a first preferred embodiment of the present invention comprises a two-section slide assembly containing an inner rail (1) and an outer rail (2). The inner rail (1) is slidable in the outer rail (2) by means of multiple inner ball bearings (31), an inner ball bearing carrier (3), and a ball bearing carrier (4) disposed on the inner rail (1). The inner rail (1) has a substantially C-shaped cross-section and comprises an upper wall (102), a lower wall (104), and a side wall (106) extending between the upper and the lower walls (102, 104). Each of the upper and the lower walls (102, 104) defines a ball receiving groove (108). The upper and the lower walls (102, 104) and the side wall (106) cooperate to define a passage (110). Each of the upper and the lower walls (102, 104) has a thickness (T1).

The outer rail (2) also has a substantially C-shaped cross-section and comprises an upper wall (202), a lower wall (204), and a side wall (206) extending between the upper and the lower walls (202, 204). Each of the upper and the lower walls (202, 204) has a thickness (T2).

The ball bearing carrier (4) is disposed near an end of the side wall (106) of the inner rail (1). The ball bearing carrier (4) is a wide and flat member including an upper ball receiving channel (41), a lower ball receiving channel (42). A plurality of ball bearings (43) are movably disposed on the upper and lower ball receiving channels (41) and (42). Both the upper and the lower ball receiving channels (41, 42) are circulating channels adapted to circulate the ball bearings (43) around a loop, and respectively contain an open section (411, 421) adapted in use to face the outer rail (2). In the first preferred embodiment of the present invention, each of the open sections (411, 421) is a section of the ball receiving groove (108) of the inner rail (1) near the end of the inner rail (1). Both ends of the each of the open sections (411,421) are respectively provided with gaps (11, 12) corresponding to the outlets of both the upper and the lower ball receiving channels (41, 42) so as to indicate loop distribution within both the upper and the lower ball receiving channels (41,42) to accommodate the multiple ball bearings (43). Each of the gaps (11, 12) is defined by a bent section of the inner rail (1) for guiding ball bearings (43) located in the gap (11, 12). The bent section is angled from the inner rail side wall (106) toward the ball bearing carrier (4), and each gap (11, 12) faces one of the outlets of the upper and the lower ball receiving channels (41, 42). The multiple ball bearings (43) roll along the open sections (411, 421) of the upper and the lower ball receiving channels (41, 42) to support the outer rail (2). Furthermore, the ball bearing carrier (4) is fixed to the inner rail (1) by means of fastening members (44). In addition, FIG. 3 shows a type of thin slide assembly which is defined by that each of the multiple ball bearings (43) has a diameter (D) which is larger than either the thickness (T1) of each of the upper and the lower walls (102, 104) of the inner rail (1) or the thickness (T2) of each of the upper and the lower walls (202, 204) of the outer rail (2). This slide assembly is adapted to connect a cable management arm and mount on a rack, and it will not affect the normal pull and push operation of the lower cable management arm, or the drawer or similar object.

Figure 4:
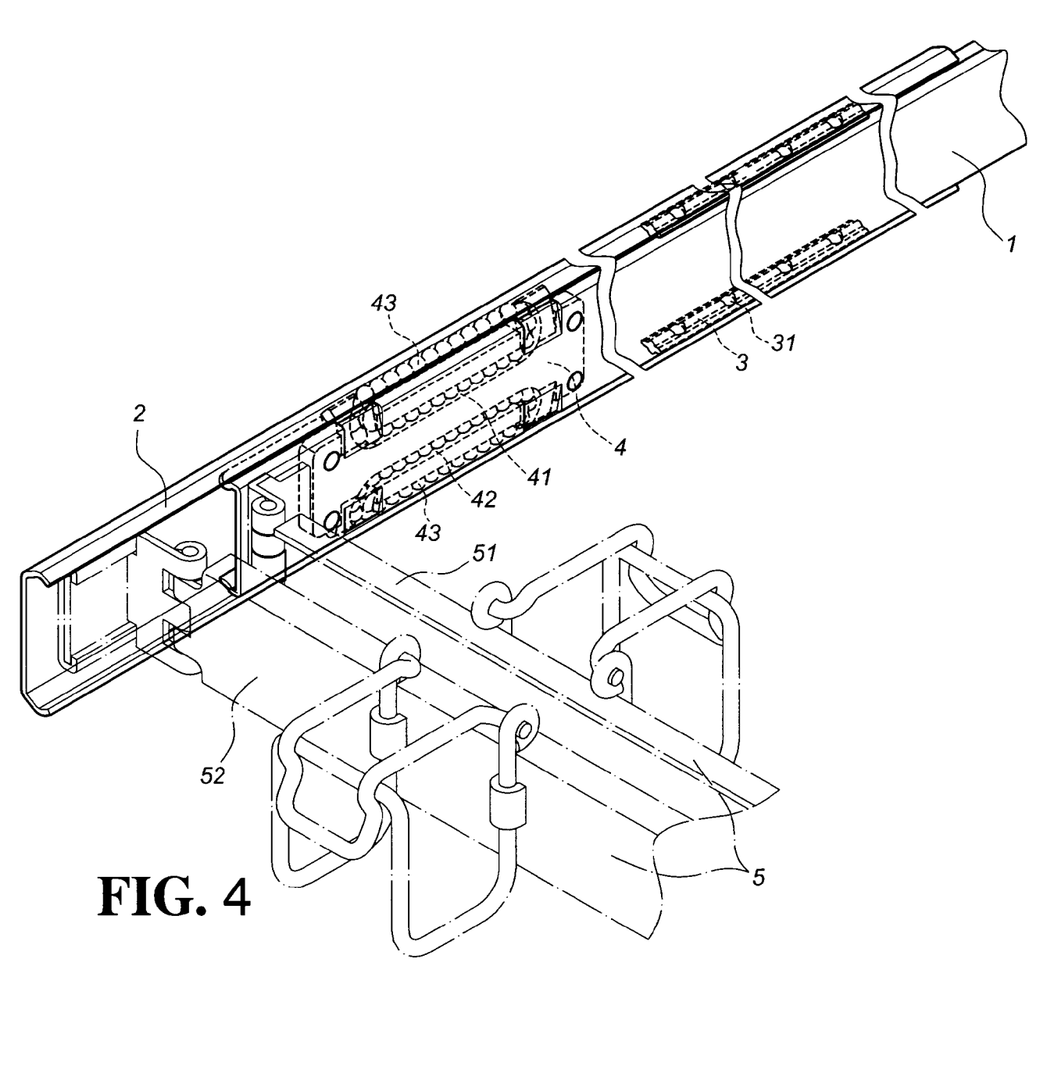
FIG. 4 is a schematic view showing retraction of a slide assembly connected to a cable management arm in the first preferred embodiment of the present invention.
Figure 5:
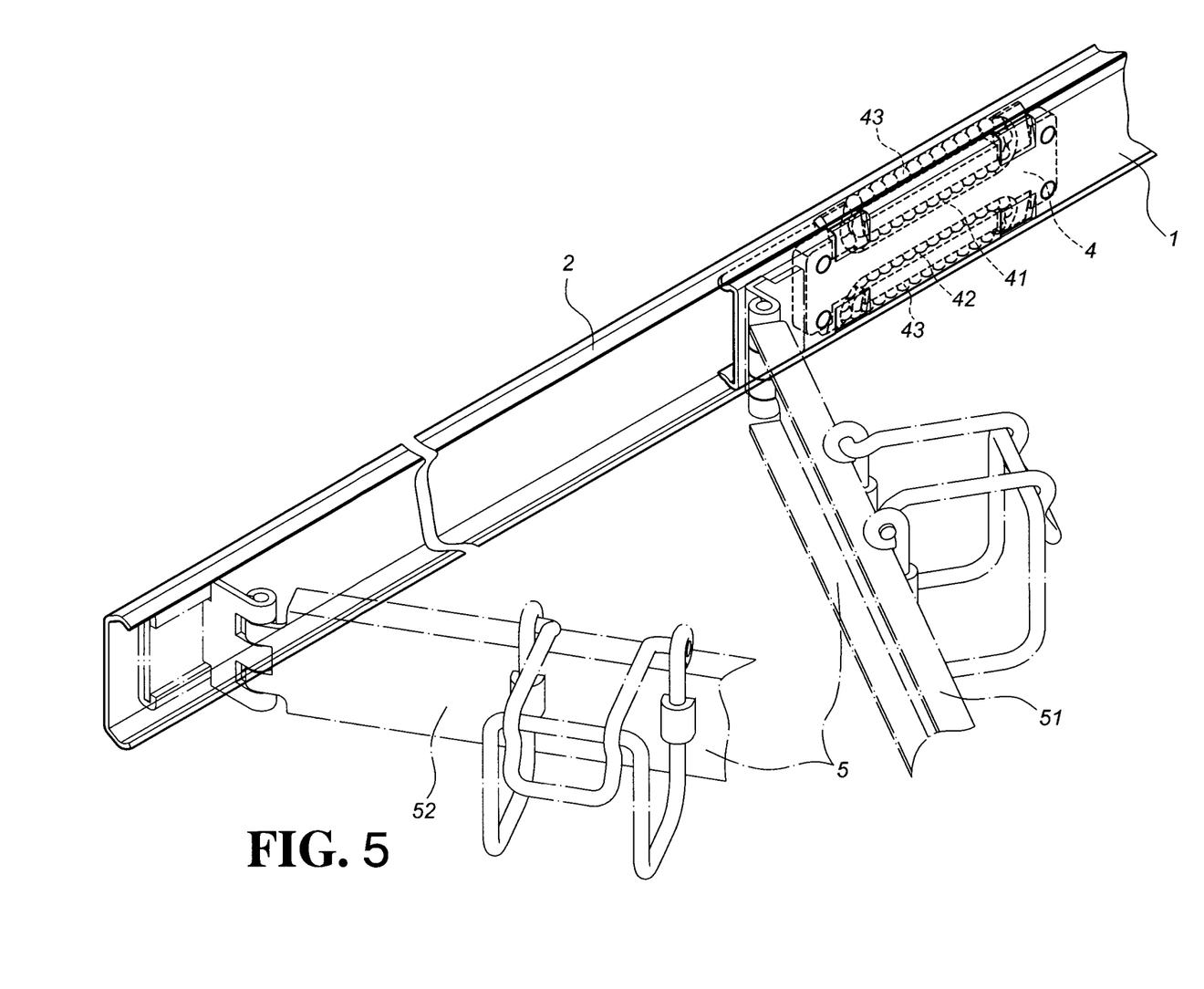
FIG. 5 is a schematic view showing a local pull and extension of the slide assembly connected to the cable management arm in the first preferred embodiment of the present invention.

FIGS. 4 and 5 show the slide assembly of the first preferred embodiment of the present invention is associated with a cable management arm (5). The inner rail (1) is supported on the outer rail (2) by means of the multiple ball bearings (43) contained in the upper and the lower ball receiving channels (41, 42). The cable management arm (5) comprises a front brace (51) and a rear brace (52), wherein the front brace (51) is secured to the end of the inner rail (1), the rear brace (52) is secured to the outer rail (2), and the front brace (51) is movable relative to the rear brace (52). Because the inner rail (1) remains supported by the outer rail (2), the cable management arm (5) is prevented from sagging since the ball bearing carrier (4) is disposed on the end of the inner rail (1) whether the slide assembly is fully retracted or sliding.

Figure 6:
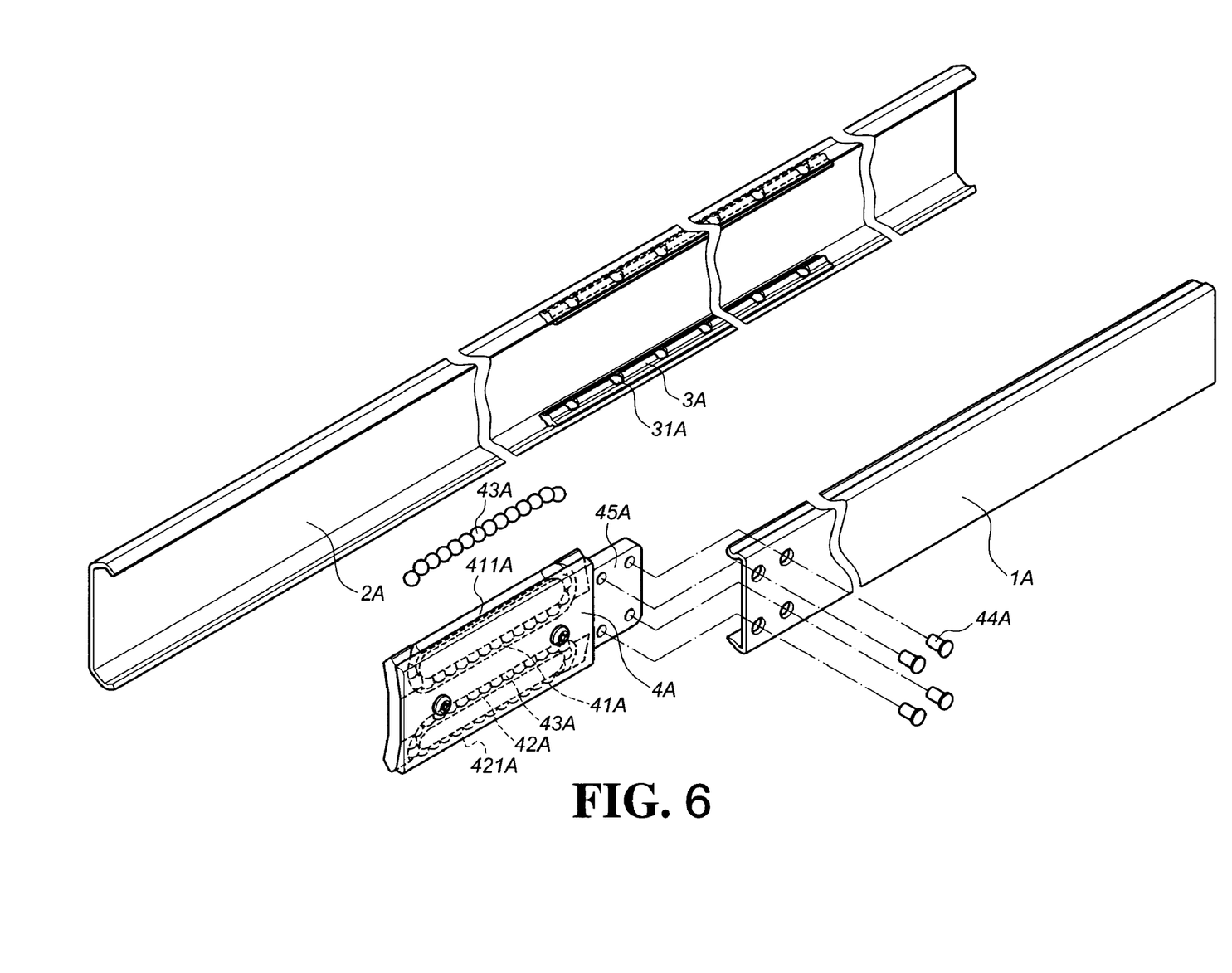
FIG. 6 is an exploded view of a primary construction of a second preferred embodiment of the present invention.
Figure 7:
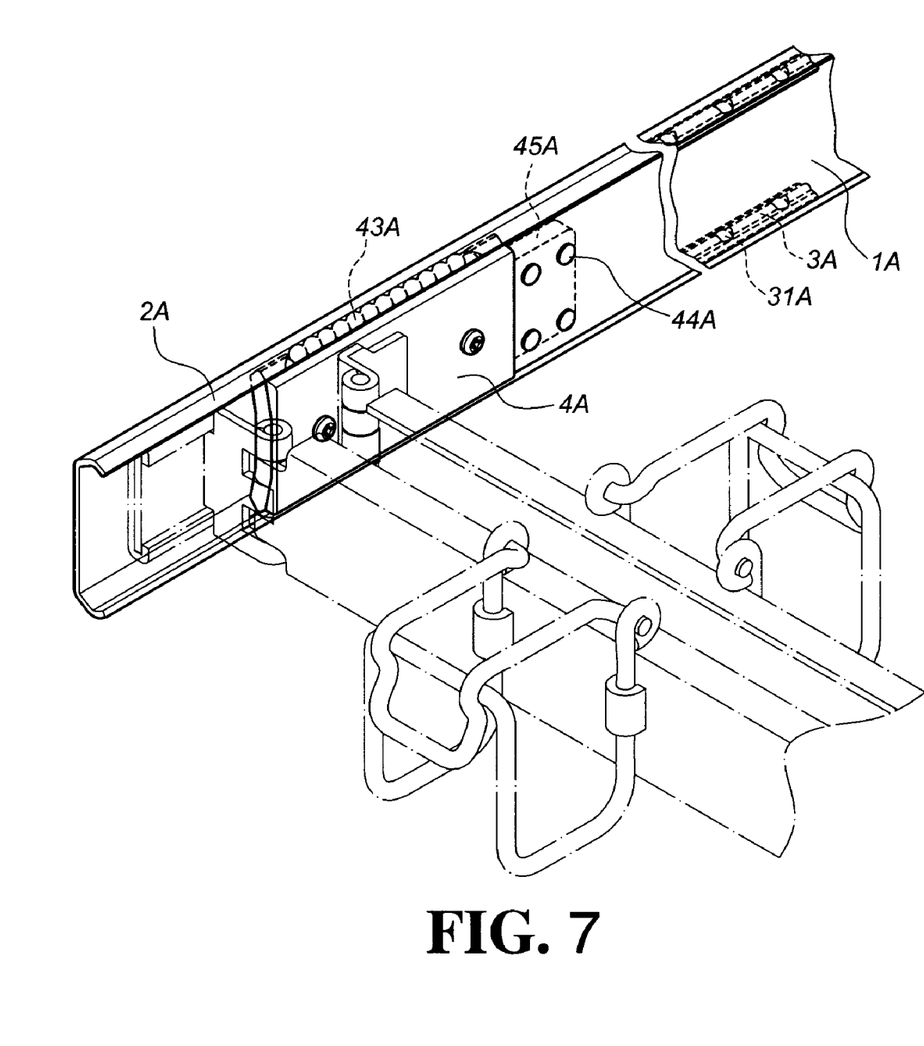
FIG. 7 is a perspective view of the second preferred embodiment of the present invention as assembled.

As illustrated in FIGS. 6 and 7, a second preferred embodiment of the present invention comprises a two-section slide assembly containing an inner rail (1A) and an outer rail (2A). The inner rail (1A) is slidable in the outer rail (2A) by means of multiple inner ball bearings (31A) and an inner ball bearing carrier (3A).

An end of the inner rail (1A) is connected to a ball bearing carrier (4A). The ball bearing carrier (4A) includes an upper ball receiving channel (41A), a lower ball receiving channel (42A), and a connection portion (45A). A plurality of ball bearings (43A) are movably disposed on the upper and lower ball receiving channels (41A) and (42A). Each of both the upper and the lower ball receiving channels (41A, 42A) is equipped with a circulating channel defining a loop and an open section (411A, 421A) located in use facing the outer rail (2A) so as to enable loop distribution in both the upper and the lower ball receiving channels (41A, 42A) to accommodate the ball bearings (43A). The multiple ball bearings (43A) roll along the open sections (411A, 421A) of the upper and the lower ball receiving channels (41A, 42A) to support the outer rail (2A). Furthermore, the connection portion (45A) of the ball bearing carrier (4A) is fixed to the end of the inner rail (1A) by means of fastening members (44A).

Figure 8:
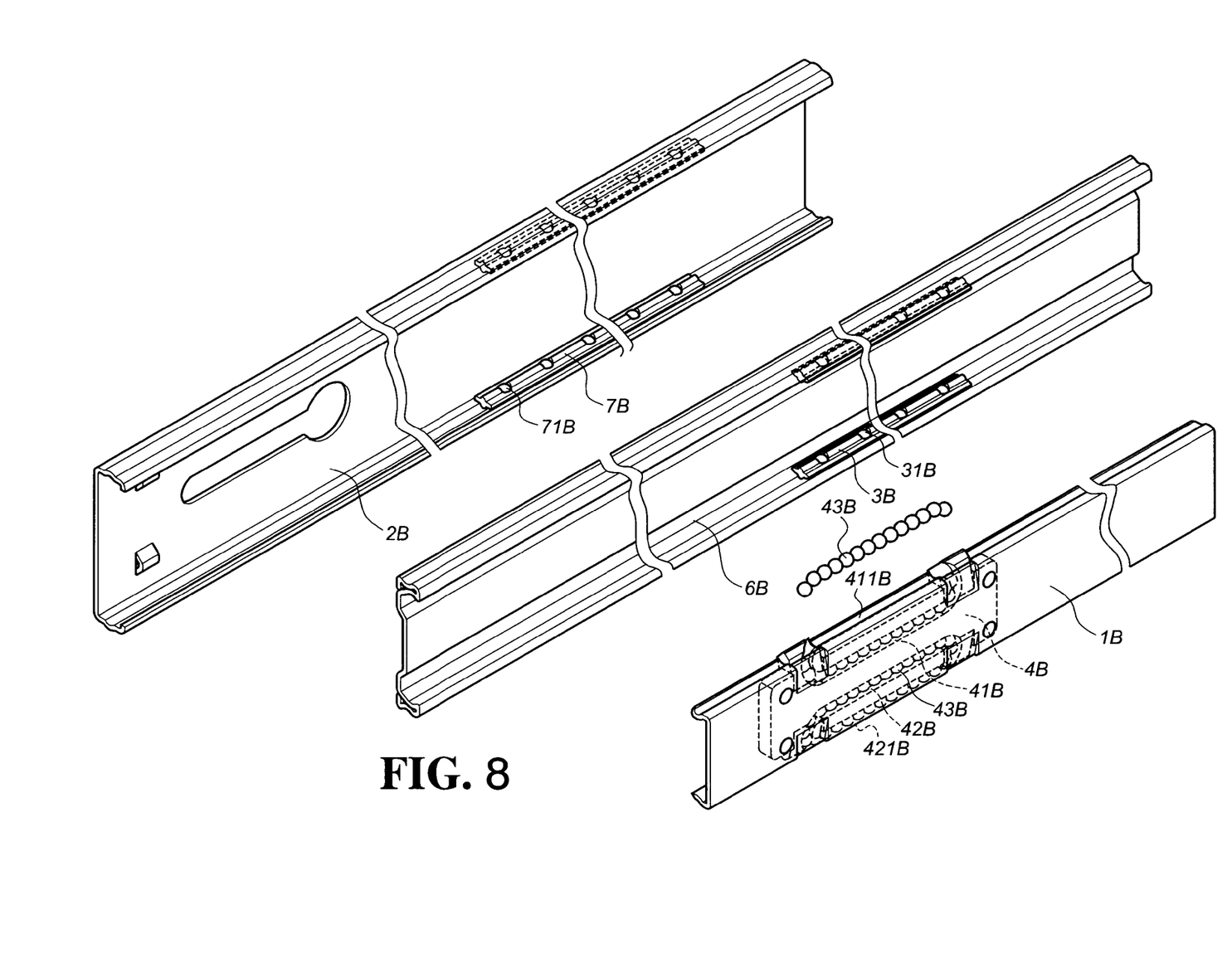
FIG. 8 is an exploded view of a third preferred embodiment of the present invention.

While a two-section slide assembly containing an inner rail and an outer rail has been the focus of the first and second preferred embodiments of the present invention, the present invention is also applicable to a three-section slide assembly. A third embodiment of the present invention comprises an inner rail (1B), a middle rail (6B) and an outer rail (2B) as illustrated in FIG. 8. The inner rail (1B) is slidable in the middle rail (6B) by means of multiple inner ball bearings (31B) and an inner ball bearing carrier (3B); and the middle rail (6B) is slidable in the outer rail (2B) by means of multiple outer ball bearings (71B) and an outer ball bearing carrier (7B).

The inner rail (1B) is provided with a ball bearing carrier (4B), and the ball bearing carrier (4B) includes an upper ball receiving channel (41B) and a lower ball receiving channel (42B). A plurality of ball bearings (43B) are movably disposed on the upper and lower ball receiving channels (41B) and (42B). Each of the upper and the lower ball receiving channels (41B, 42B) defines a looped circulating channel, and includes an open section (411B, 421B) located in use facing in relation to the middle rail (6B) so as to enable looped distribution in the upper and the lower ball receiving channels (41B, 42B) to accommodate the multiple ball bearings (43B). The multiple ball bearings (43B) roll along the open sections (411B, 421B) of the upper and the lower ball receiving channels (41B, 42B) to support the middle rail (6B).

Figure 9:
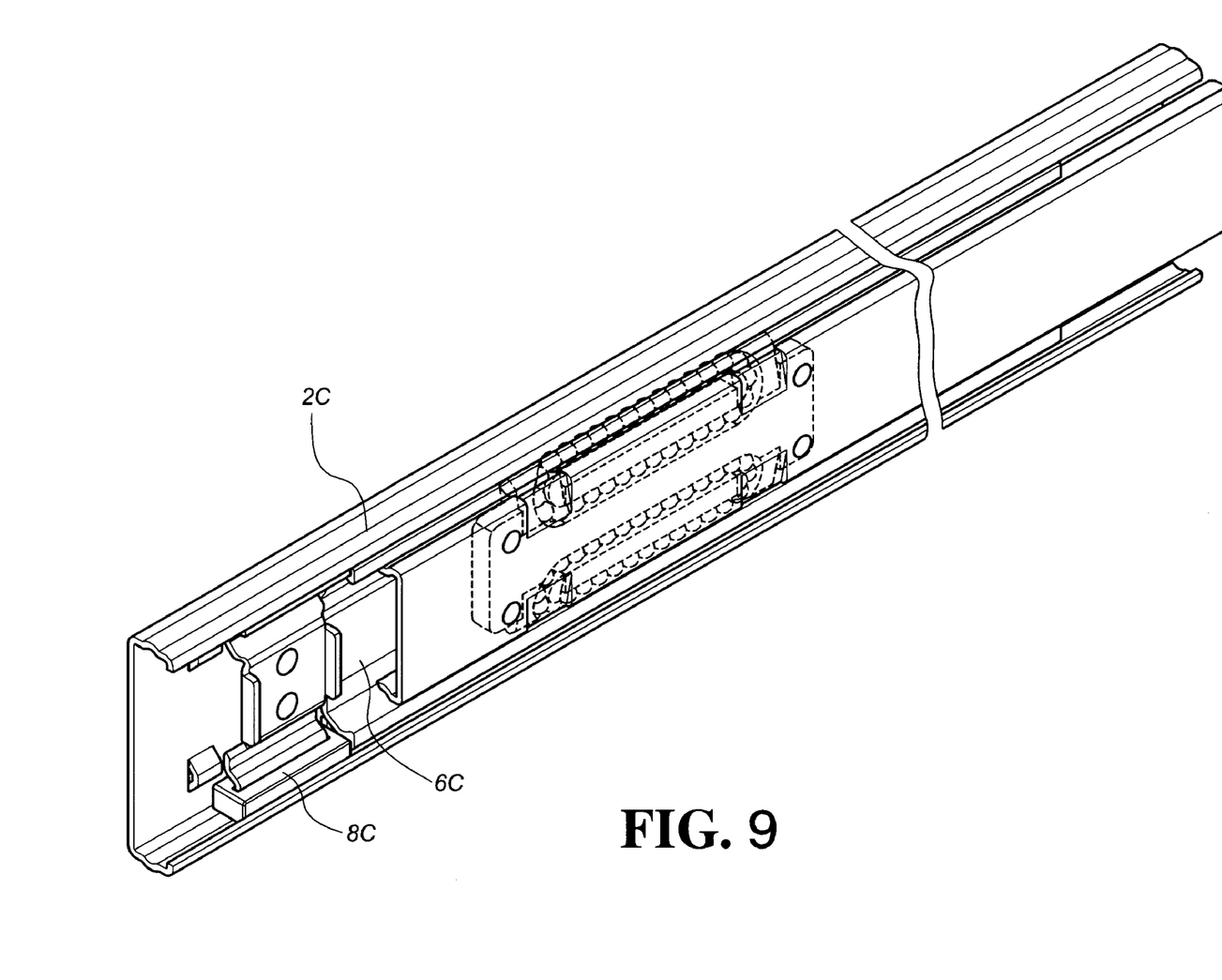
FIG. 9 is a perspective view of a primary construction of a fourth preferred embodiment of the present invention.

Furthermore, a fourth preferred embodiment of the present invention as illustrated in FIG. 9, a support base (8C) is disposed at the end of a middle rail (6C) for the middle rail (6C) to extend into an outer rail (2C) by means of the support base (8C).

What is claimed is:

1. A slide assembly, comprising:
   an outer rail;
   an inner rail slidably connected to the outer rail, the inner rail comprising an upper wall, a lower wall, and a side wall extending between the upper and the lower walls, each of the upper and the lower walls defining a ball receiving groove, the upper and the lower walls and the side wall cooperating to define a passage;
   a ball bearing carrier fixed on the side wall of the inner rail, the ball bearing carrier comprising an upper ball receiving channel and a lower ball receiving channel, each of the upper and the lower ball receiving channels defining a circulating channel having outlets, each of the upper and the lower ball receiving channels including an open section located in use facing the outer rail; and
   a plurality of ball bearings being contained in both the upper and the lower ball receiving channels, and the ball bearings rolling along the open sections of the upper and the lower ball receiving channels to support the outer rail;
   wherein each of the open sections of the upper and the lower ball receiving channels receives a section of the ball receiving groove of the inner rail near an end of the inner rail, and both ends of each of the open sections of the inner rail are provided with a gap defined by a bent section of said inner rail for guiding ball bearings located in said gap, said bent section being angled from said inner rail side wall toward said ball bearing carrier, each gap facing a respective one of the outlets of the upper and the lower ball receiving channels.

2. The slide assembly of claim 1, wherein the ball bearing carrier is fixed near the end of the inner rail.

3. The slide assembly of claim 1, wherein each of the plurality of ball bearings has a diameter larger than either a thickness of each of the upper and the lower walls of the inner rail or a thickness of each of the upper and the lower walls of the outer rail.

4. A slide assembly, comprising:
   an outer rail;
   a middle rail slidably connected to the outer rail;
   an inner rail slidably connected to the middle rail, the inner rail comprising an upper wall, a lower wall, and a side wall extending between the upper and the lower walls, each of the upper and the lower walls defining a ball receiving groove, the upper and the lower walls and the side wall cooperating to define a passage;
   a ball bearing carrier fixed on the side wall of the inner rail, the ball bearing carrier comprising an upper ball receiving channel and a lower ball receiving channel, each of the upper and the lower ball receiving channels defining a circulating channel having outlets, each of the upper and the lower ball receiving channels including an open section located in use facing the middle rail; and
   a plurality of ball bearings being contained in both the upper and the lower ball receiving channels, and the ball bearings rolling along the open sections of the upper and the lower ball receiving channels to support the middle rail;
   wherein each of the open sections of the upper and the lower ball receiving channels receives a section of the ball receiving groove of the inner rail near an end of the inner rail, and both ends of each of the open sections of the inner rail are provided with a gap defined by a bent section of said inner rail for guiding ball bearings located in said gap, said bent section being angled from said inner rail side wall toward said ball bearing carrier, each gap facing a respective one of the outlets of the upper and the lower ball receiving channels.

5. The slide assembly of claim 4, further comprising a support base disposed at an end of the middle rail and the support base extends into the outer rail.

6. A slide assembly of a foldable cable management arm, comprising:
   an outer rail;
   an inner rail slidably connected to the outer rail, the inner rail comprising an upper wall, a lower wall, and a side wall extending between the upper and the lower walls, each of the upper and the lower walls defining a ball receiving groove, the upper and the lower walls and the side wall cooperating to define a passage;
   a ball bearing carrier fixed on the inner rail, the ball bearing carrier comprising an upper ball receiving channel and a lower ball receiving channel, each of the upper and the lower ball receiving channels defining a circulating channel having outlets, each of the upper and the lower ball receiving channels including an open section located in use facing the outer rail; and
   a plurality of ball bearings being contained in both the upper and the lower ball receiving channels, the ball bearings rolling along the open sections of the upper and the lower ball receiving channels to support the outer rail;
   wherein each of the open sections of the upper and the lower ball receiving channels receives a section of the ball receiving groove of the inner rail near an end of the inner rail, and both ends of each of the open sections of the inner rail are provided with a gap defined by a bent section of said inner rail for guiding ball bearings located in said gap, said bent section being angled from said inner rail side wall toward said ball bearing carrier, each gap facing a respective one of the outlets of the upper and the lower ball receiving channels;

wherein the cable management arm comprises a front brace and a rear brace, the front brace is secured to the end of the inner rail, the rear brace is secured to the outer rail, and the front brace is movable relative to the rear brace.

* * * * *